(12) United States Patent
Murata

(10) Patent No.: US 6,281,045 B1
(45) Date of Patent: Aug. 28, 2001

(54) SEMICONDUCTOR APPARATUS, MANUFACTURING METHOD THEREOF AND ELECTRONIC APPARATUS

(75) Inventor: Akihiro Murata, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/235,237

(22) Filed: Jan. 22, 1999

(30) Foreign Application Priority Data

Jan. 28, 1998 (JP) .................................................. 10-030550

(51) Int. Cl.⁷ .................................................. H01L 21/44
(52) U.S. Cl. ............................ 438/113; 438/118; 438/460
(58) Field of Search .................................... 438/110, 113, 438/114, 121, 122, 124, 128, 460, 464, 465, 458

(56) References Cited

U.S. PATENT DOCUMENTS 5,083,191 * 1/1992 Ueda ...................................... 257/783
5,547,906 * 8/1996 Badehi ................................... 438/109
5,977,629 * 11/1999 Fogal et al. ........................... 257/712

FOREIGN PATENT DOCUMENTS 8-107161   4/1996   (JP) .

* cited by examiner

Primary Examiner—Stephen D. Meier
Assistant Examiner—Jeff Vockrodt
(74) Attorney, Agent, or Firm—Oliff & Berridge, PLC

(57) ABSTRACT

A semiconductor apparatus, method of manufacturing the same, and an electronic apparatus are provided that improve the productivity and reduce the manufacturing cost. A plurality of semiconductor devices 16 may be mounted on a substrate 10. The semiconductor devices 16 may be sealed by resin 19. A heat radiation plate 18 may be mounted and the substrate 10 and the heat radiation plate 18 may be cut into pieces corresponding to the respective semiconductor devices 16.

10 Claims, 6 Drawing Sheets

SEMICONDUCTOR APPARATUS, MANUFACTURING METHOD THEREOF AND ELECTRONIC APPARATUS

BACKGROUND OF THE INVENTION

1. Field of Invention

The present invention relates to a semiconductor apparatus, method of manufacturing the same and an electronic apparatus having the same.

2. Description of Related Art

Ball Grid Array (BGA) type packages and Chip Size/Scale Package (CSP) type packages are attracting attention as the performance of semiconductor apparatuses further improve. BGA type packages can meet requirements for smaller size semiconductor apparatuses having an increased number of pins. CSP type packages can also meet requirements for smaller size semiconductor apparatuses.

Conventionally, packages are individually formed for semiconductor chips one by one, which results in a lowered productivity. Also, when a semiconductor apparatus is miniaturized or provided with a great number of pins, a heat radiation plate is attached thereto to improve the heat radiation efficiency. Heat radiation plates are individually attached to semiconductor chips one by one during the package forming process. Japanese Laid-open Patent Application HEI 8-107161, the subject matter of which is incorporated herein by reference, describes a method in which a plurality of semiconductor chips are first provided in a package configuration and then the package is cut into individual chips. However, this reference does not suggest the attachment of any heat radiation plate.

Accordingly, conventional manufacturing processes do not meet requirements for increasing productivity and reducing costs.

SUMMARY OF THE INVENTION

The present invention solves the above-described problems. It is an object of the present invention to provide a semiconductor apparatus, a method of manufacturing the same and an electronic apparatus that achieves excellent productivity and reduces the manufacturing costs.

A method of manufacturing a semiconductor apparatus according to the present invention may include a step of attaching a plurality of semiconductor devices to a substrate, a step of sealing each of the semiconductor devices with resin, a step of attaching a heat radiation plate and a step of cutting the substrate and the heat radiation plate corresponding to each of the semiconductor devices.

A plurality of semiconductor apparatuses may be simultaneously formed in a package configuration and cut into separate pieces. As a consequence, productivity is improved and the manufacturing cost is reduced. Furthermore, the heat radiation plate may also be cut into pieces at the same time. As a result, semiconductor apparatuses having improved heat radiation efficiency are provided without individually attaching a heat radiation plate to each of the semiconductor apparatuses.

After the heat radiation plate is attached to the semiconductor devices, resin may be injected between the substrate and the heat radiation plate.

As a result, the resin may be injected in an area defined by the substrate and the heat radiation plate.

In accordance with the manufacturing method according to the present invention, a metal mold may be brought into a tight contact with an opening section defined at sides of the substrate and the heat radiation plate. The resin may be injected into a space defined by the substrate, the heat radiation plate and the metal mold. As a result, the resin can be prevented from flowing out of the substrate.

In accordance with the manufacturing method according to the present invention, the substrate having the semiconductor devices and the heat radiation plate attached thereto may be disposed in a cavity defined by an upper metal mold and a lower metal mold. The resin may be injected between the substrate and the heat radiation plate. As a result, resin sealing may be achieved within the upper and lower metal molds.

In accordance with the manufacturing method according to the present invention, a plurality of opening sections may be formed in the heat radiation plate, and the periphery of the substrate having the semiconductor devices attached thereto may be surrounded by a frame member. The heat radiation plate may be disposed on the frame member, and the resin may be injected through the opening sections of the heat radiation plate. As a result, a metal mold is not required when resin is injected.

In accordance with the manufacturing method according to the present invention, each of the opening sections in the heat radiation plate may be formed between adjacent ones of the semiconductor devices, and on cutting lines of the heat radiation plate. The radiation plate may be readily cut by disposing the opening sections on the cutting lines.

In accordance with the manufacturing method according to the present invention, resin is provided to cover all of the semiconductor devices on one surface of the substrate, and the heat radiation plate is pressed against the resin. As a result, the resin is provided by a potting method, and accordingly, the resin sealing process is readily performed.

A semiconductor apparatus in accordance with the present invention may be manufactured by the methods described above.

An electronic apparatus in accordance with the present invention may also have circuit board including a semiconductor apparatus mounted thereon.

Other objects, advantages and salient features of the invention will become apparent from the following detailed description taken in conjunction with the annexed drawings which disclose preferred embodiments of the invention.

BRIEF DESCRIPTION OF THE DRAWINGS

The invention will be described with reference to the following drawings in which like reference numerals refer to like elements and wherein.

DETAILED DESCRIPTION OF PREFERRED EMBODIMENTS

FIGS. 1(A) through 1(E) illustrate a method of manufacturing a semiconductor apparatus in accordance with an embodiment of the present invention.

Figure 1A:
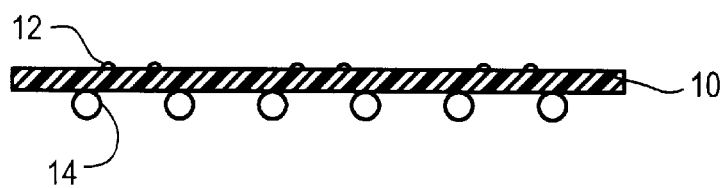
FIGS. 1(A)–FIG. 1(E) illustrate a method of manufacturing a semiconductor apparatus in accordance with an embodiment of the present invention.

A substrate 10 is initially prepared as shown in FIG. 1(A). The substrate 10 may be of the same type that is used when semiconductor devices (semiconductor chip) are mounted in BGA type or CSP type packages. In accordance with the present embodiment, the substrate 10 may be formed from resin. However, it may be formed from ceramics or metal. Alternatively, a film carrier tape may be used as the substrate 10. Writing patterns (not shown) maybe formed on both surfaces of the substrate 10. Solder bumps 12 may be formed on one of the surfaces and solder balls 14 may be formed on the other surface.

Figure 1B:
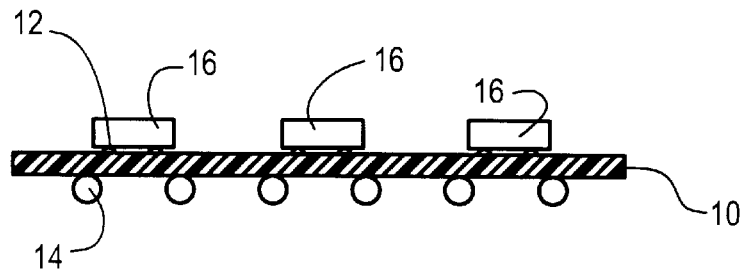

Electrodes (not shown) of a plurality of semiconductor devices 16 may be connected to the solder bumps 12 on the substrate 10 as shown in FIG. 1(B). In other words, the semiconductor devices 16 may be facedown bonded to the solder bumps 12. In another embodiment, the solder bumps 12 need not be formed on the substrate 10. Rather, solder bumps 12 may be formed on the electrodes of the semiconductor devices 16.

Figure 1C:
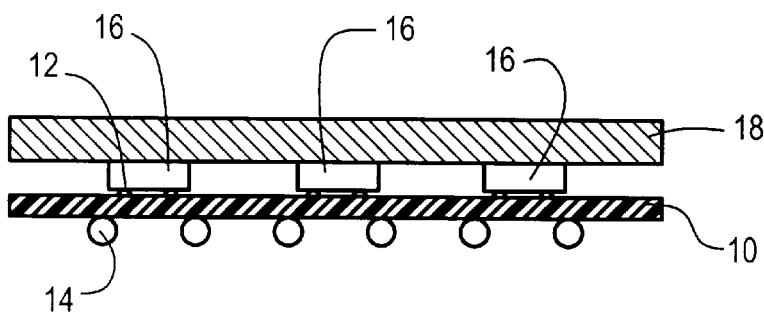

As shown in FIG. 1(C), a heat radiation plate 18 may be attached to surfaces of the semiconductor devices 16 opposite of the bonding surfaces between the semiconductor devices 16 and the substrate 10. The heat radiation plate 18 is large enough to attach to all of the semiconductor devices 16. The heat radiation plate 18 may be formed from a material having high thermal conductivity such as copper, copper alloy, and the like. The heat radiation plate 18 is preferably adhered to the semiconductor devices 16 by adhesive or adhesive tapes having appropriate thermal conductivity.

Figure 1D:
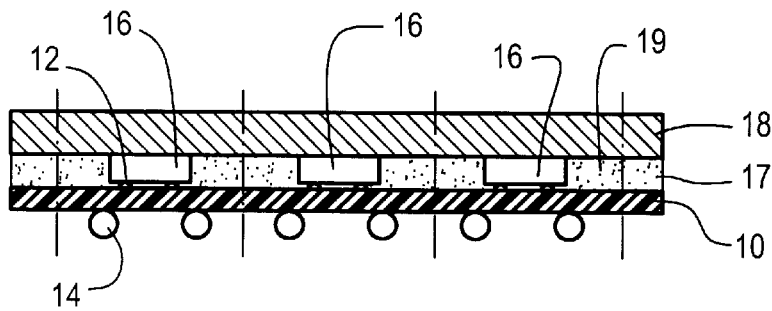

Then, as shown in FIG. 1(D), resin 19 may be injected in a space between the heat radiation plate 18 and the substrate 10. More specifically, the resin 19 is injected through an opening 17 at the sides of the heat radiation plate 18 and the substrate 10. The resin 19 surrounds and seals the semiconductor devices 16 and covers and protects opposing surfaces of the heat radiation plate 18 and the substrate 10.

When the resin 19 solidifies, the heat radiation plate 18, the resin 19 and the substrate 10 may be cut at cutting positions indicated by dot-and-dash lines. The cutting positions are located between adjacent ones of the semiconductor devices 16.

Figure 1E:
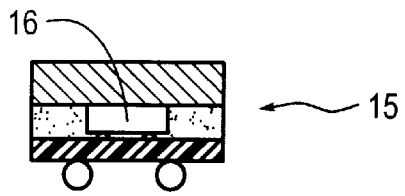

As a result, a semiconductor apparatus 15 such as that shown in FIG. 1(E) may be obtained. As described above, the plurality of semiconductor devices 16 may be attached to the substrate 10. Therefore, the plurality of semiconductor apparatuses 15 are obtained by cutting at positions corresponding to the respective semiconductor devices 16.

The plurality of semiconductor devices 16 may be simultaneously provided in a package configuration, and then cut into pieces. As a consequence, excellent productivity is achieved and manufacturing cost is reduced. Moreover, because the heat radiation plate 18 is also cut at the same time, the heat radiation plate 18 does not have to be individually attached to each of the semiconductor devices 16. As a result, the plurality of semiconductor apparatuses 15 having improved thermal radiation capability are obtained at the same time.

Figure 2A:
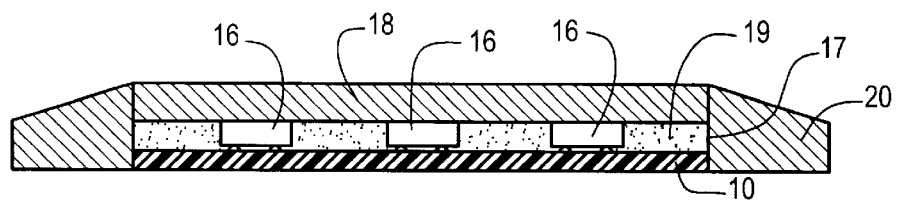
FIGS. 2(A) and 2(B) illustrate a method of manufacturing a semiconductor apparatus in accordance with an embodiment of the present invention.
Figure 2B:
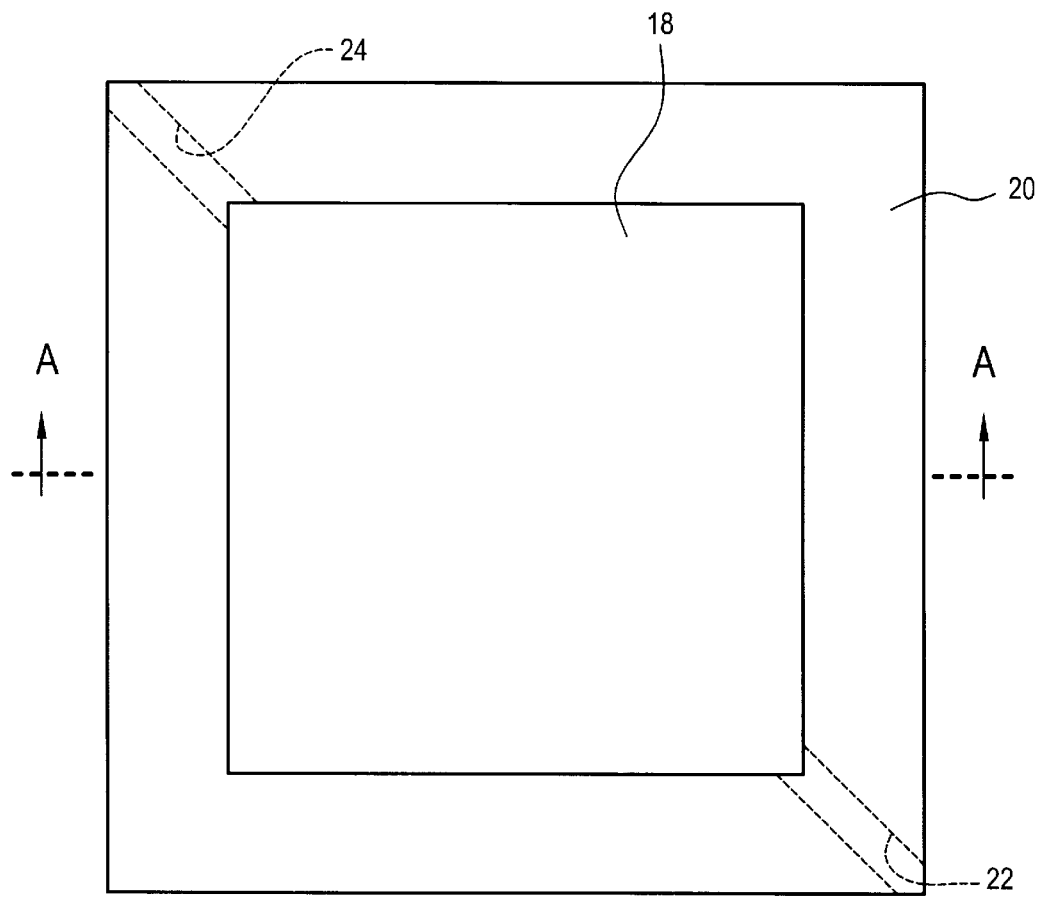

FIGS. 2(A) and 2(B) also illustrate a method of manufacturing a semiconductor apparatus. FIG. 2(A) is a cross-sectional view taken along line A—A of FIG. 2(B). This embodiment uses a resin injection method that is different than the process of injecting the resin 19 in the embodiment shown in FIG. 1(D). In the FIG. 1 embodiment, the solder balls 14 are pre-installed on the substrate 10. However, in accordance with this embodiment, solder balls 14 are installed on a substrate 10 after injection of resin 19.

In accordance with this embodiment, as shown in FIGS. 2(A) and 2(B), a frame-like metal mold 20 is disposed along the periphery of the substrate 10 that is provided with semiconductor devices 16 and a heat radiation plate 18. The metal mold 20 closes openings 17 formed at the sides of the substrate 10 and the heat radiation plate 18. However, as shown in FIG. 2(B), the metal mold 20 has an injection opening 22 and a ventilation opening 24 that communicates with the openings 17. The resin 19 is supplied through the injection opening 22, and air is discharged through the ventilation opening 24 to thereby create a vacuum inside.

Accordingly, the resin 19 is injected into a space defined by the substrate 10, the heat radiation plate 18 and the metal mold 20.

When injection of the resin 19 is completed, solder balls 14 are provided on the substrate 10. Then, they are cut into pieces corresponding to the respective semiconductor devices 16. As a consequence, a semiconductor apparatus 15 as shown in FIG. 1(E) is obtained.

Figure 3:
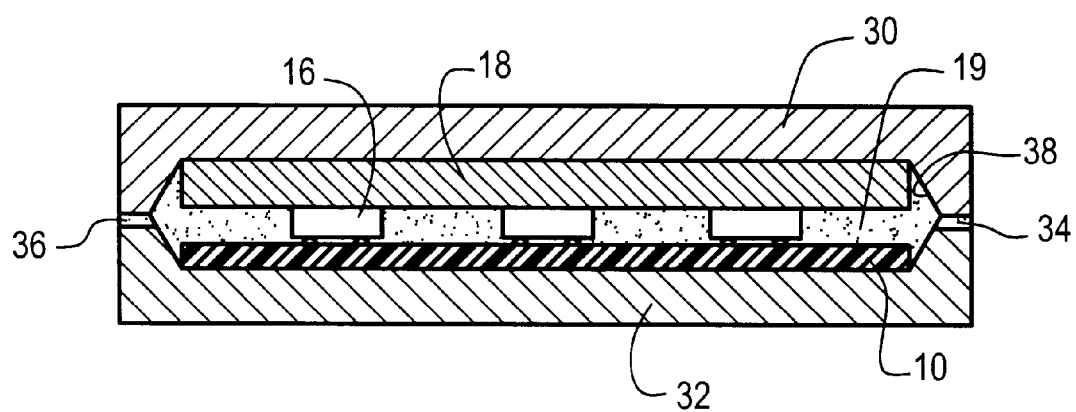
FIG. 3 illustrates a method of manufacturing a semiconductor apparatus in accordance with an embodiment of the present invention.

FIG. 3 illustrates a method of manufacturing a semiconductor apparatus in accordance with another embodiment of the present invention. This embodiment uses a metal mold that is different than the embodiment shown in FIG. 2.

In accordance with this embodiment shown in FIG. 3, an upper metal mold 30 and a lower metal mold 32 are used. A substrate 10 having semiconductor devices 16 and a heat radiation plate 18 mounted thereon is disposed in a cavity 38 formed by the upper metal mold 30 and the lower metal mold 32. Resin 19 is injected through an injection opening 34 that communicates with the cavity 38, and air is discharged through an air vent opening 36 to thereby create a vacuum inside.

The substrate 10 and the lower metal mold 32 are in tight contact with one another and the heat radiation plate 18 and the upper metal mold 30 are in tight contact with one another. As a result, the resin 19 does not flow out onto external surfaces of the substrate 10 and the heat radiation plate 18.

When injection of the resin 19 is completed, solder balls 14 are provided on the substrate 10. Then, they are cut into pieces corresponding to the respective semiconductor devices 16. As a consequence, a semiconductor apparatus 15 as shown in FIG. 1(E) is obtained.

Figure 4A:
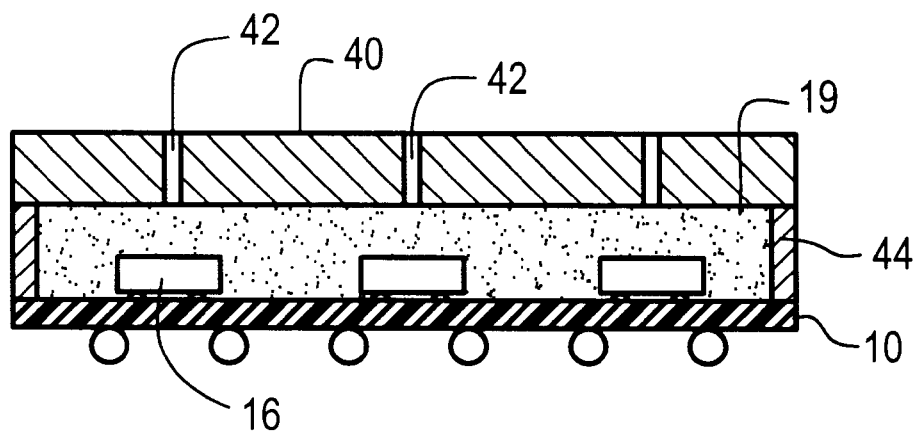
FIGS. 4(A) and 4(B) illustrate a method of manufacturing a semiconductor apparatus in accordance with an embodiment of the present invention.
Figure 4B:
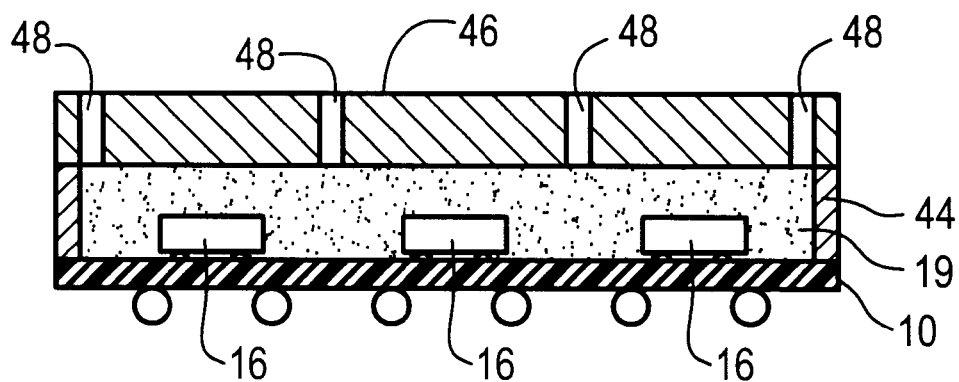

FIGS. 4(A) and 4(B) illustrate a method of manufacturing a semiconductor apparatus in accordance with another embodiment of the present invention. This embodiment differs from the FIG. 1 embodiment in terms of the resin injection method.

More specifically, as shown in FIG. 4(A), a frame member 44 may be disposed at a peripheral section of the substrate 10, and a heat radiation plate 40 may be mounted on the frame member 44. The frame member 44 has a shape that conforms to the peripheral shape of the substrate 10, and surrounds the periphery of the substrate 10. By mounting the heat radiation plate 40 on the frame member 44, the substrate 10, the frame member 44 and the heat radiation plate 40 may define a specified space.

Also, a plurality of opening sections 42 may be provided in the heat radiation plate 40 and the resin 19 may be injected through at least one of the opening sections 42 to achieve sealing by the resin 19. Other opening sections 42 may function as air vent holes.

As shown in FIG. 4(A), the opening sections 42 in the heat radiation plate 40 are provided above the semiconductor devices 16. In other embodiments, they may be disposed in a different manner as shown in FIG. 4(B). More specifically, as shown in FIG. 4(B), the opening sections 48 in the heat radiation plate 46 may be disposed above intermediate sections between the semiconductor devices 16. In other words, they may be disposed in areas where the heat radiation plate 46 is cut. As a result, the heat radiation plate 46 may be readily cut.

Figure 5A:
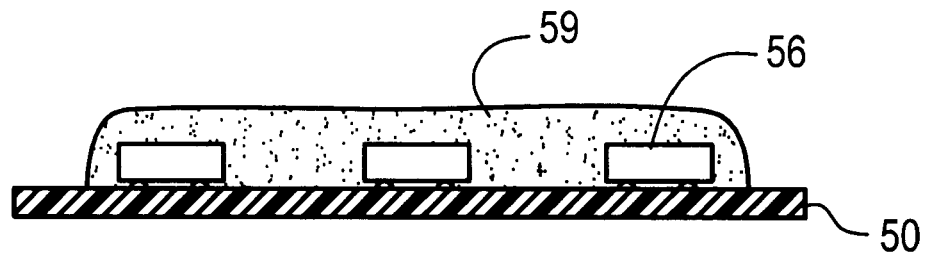
FIGS. 5(A) and 5(B) illustrate a method of manufacturing a semiconductor apparatus in accordance with an embodiment of the present invention.
Figure 5B:
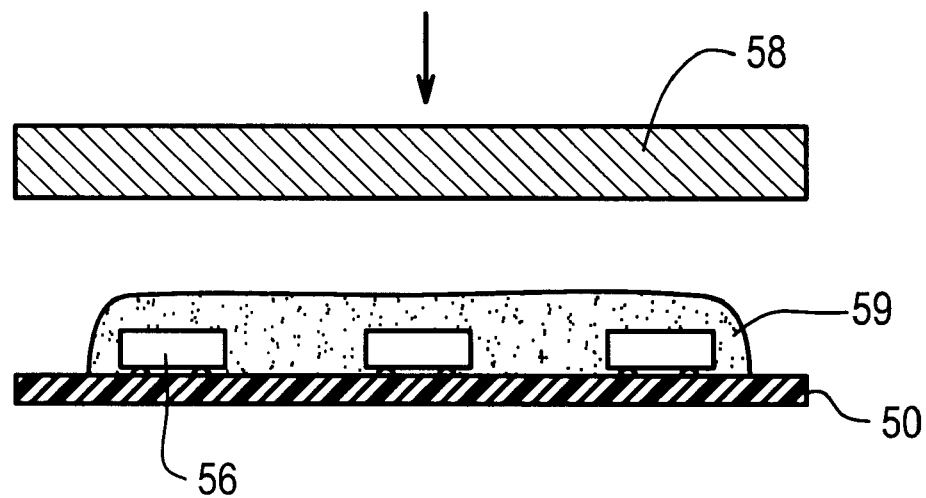

FIGS. 5(A) and 5(B) illustrate a method of manufacturing a semiconductor apparatus in accordance with another embodiment of the present invention. This embodiment differs from the FIG. 1 embodiment in terms of the time sequence of injection of resin and mounting of a heat radiation plate.

In this embodiment, resin 59 may be potted on a substrate 50 having semiconductor devices 56 attached thereto as shown in FIG. 5(A). A heat radiation plate 58 may then be mounted as shown in FIG. 5(B). More specifically, the heat radiation plate 58 may be placed on the potted resin 59 and pressure applied to the heat radiation plate 58 so as to mount the heat radiation plate 58. As a result, the heat radiation plate 58 is brought into close contact with the semiconductor devices 56 by the resin 59. Adhesive can therefore be omitted. When the heat radiation plate 58 is mounted, the resin 59 is cured at 100° C.–200° C. for 1–6 hours, and solder balls that define external terminals are attached. Then, they are cut into pieces. This embodiment achieves the same effects as the other embodiments described above.

The present invention is not limited to the embodiments described above, and a variety of modifications can be made. For example, in the above embodiments, semiconductor devices may be bonded in a face down bonding method. However, in another embodiment, a wire bonding method may be employed.

Figure 6:
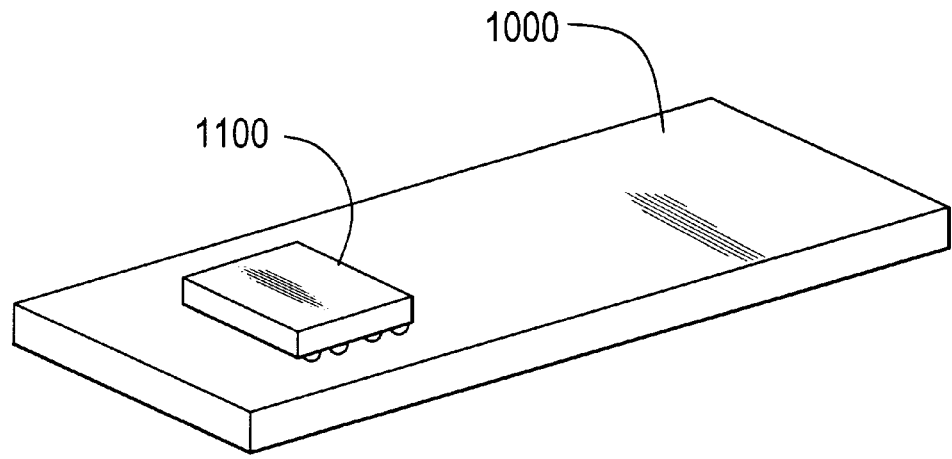
FIG. 6 illustrates a circuit substrate provided with a semiconductor apparatus mounted thereon that is manufactured in accordance with the present invention.

FIG. 6 shows a circuit substrate 1000 that is provided with a semiconductor apparatus 1100 which is manufactured by a method of the present invention. The circuit substrate 1000 is generally formed from an organic material substrate such as a glass epoxy substrate. Wiring patterns of copper or the like defining specified circuits are provided on the circuit substrate. The wiring patterns and bumps of the semiconductor devices are mechanically connected to achieve electrical conduction therebetween.

Figure 7:
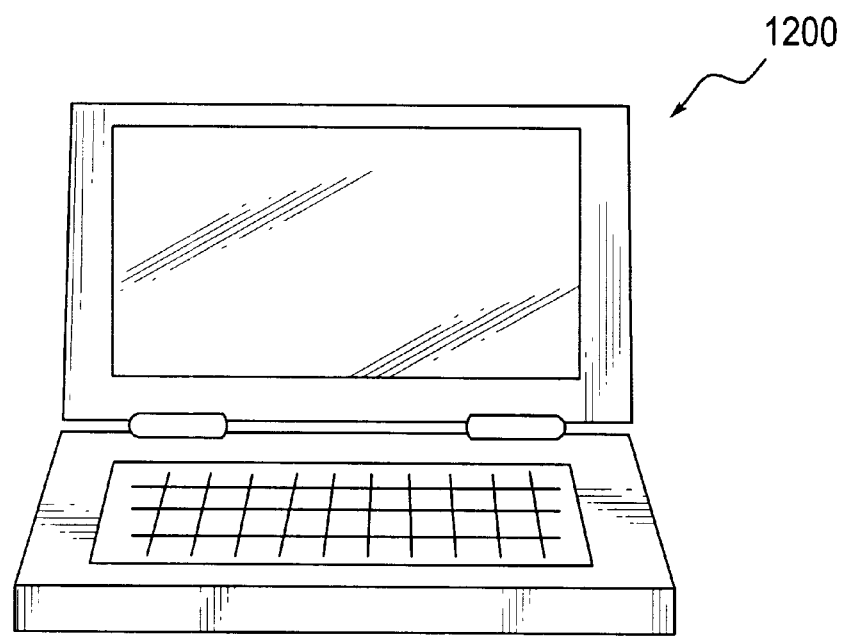
FIG. 7 illustrates an electronic apparatus in accordance with the present invention.

FIG. 7 shows a notebook type personal computer 1200 as an example of an electronic apparatus equipped with the circuit substrate 1000.

The present invention may be applicable to a method of manufacturing electronic devices (including both active devices and passive devices) for the surface mounting that requires bumps as required by semiconductor apparatuses. The electronic devices may include resistors, capacitors, coils, oscillators, filters, temperature sensors, thermistors, varistors, volumes, fuses, and the like, for example.

While the invention has been described in relation to preferred embodiments, many modifications and variations are intended to be within the scope of the preset invention as defined in the appended claims.

What is claimed is:

1. A method of manufacturing a semiconductor apparatus, the method comprising:

attaching a plurality of semiconductor devices to a substrate;

sealing each of the semiconductor devices with resin;

attaching a heat radiation plate on the semiconductor devices attached to the substrate;

subsequently cutting the substrate and the heat radiation plate at areas corresponding to each of the semiconductor devices; and wherein after the heat radiation plate is attached on the semiconductor devices, the resin is injected between the substrate and the heat radiation plate so as to seal the semiconductor devices with resin.

2. The method of claim 1, further comprising the step of connecting a metal mold to an opening section defined at sides of the substrate and the heat radiation plate, and the resin is injected into a space defined by the substrate, the heat radiation plate and the metal mold to seal the semiconductor devices with resin.

3. The method of claim 1, further comprising the step of attaching an upper metal mold and a lower metal mold about the substrate and semiconductor devices to form a cavity, wherein the resin is injected between the substrate and the heat radiation plate.

4. The method of claim 1, wherein the heat radiation plate includes a plurality of openings and the method further comprises attaching a frame member around a periphery of the substrate having the semiconductor devices attached thereto, and disposing the heat radiation plate on the frame member, and wherein the resin is injected through the openings of the heat radiation plate.

5. The method of claim 4, wherein each of the openings in the heat radiation plate is disposed between adjacent ones of the semiconductor devices and formed on cutting lines of the heat radiation plate.

6. A method of manufacturing a semiconductor device comprising the steps of:

attaching a plurality of semiconductor devices to a substrate;

placing a heat radiation plate over the plurality of semiconductor devices; and subsequently cutting the substrate and the heat radiation plate to separate each of the semiconductor devices, further comprising the step of sealing the semiconductor devices to the substrate using resin;

wherein after the heat radiation plate is placed on the semiconductor devices, the resin is injected between the substrate and the heat radiation plate so as to seal the semiconductor devices with resin.

7. A method of manufacturing a semiconductor device comprising the steps of:

attaching a plurality of semiconductor devices to a substrate;

placing a heat radiation plate over the plurality of semiconductor devices; and subsequently cutting the substrate and the heat radiation plate to separate each of the semiconductor devices, further comprising the step of sealing the semiconductor devices to the substrate using resin; and the step of connecting a metal mold at sides of the substrate and the heat radiation plate, and the resin is injected into an opening of the metal mold to seal the semiconductor devices with resin.

8. A method of manufacturing a semiconductor device comprising the steps of:

attaching a plurality of semiconductor devices to a substrate;

placing a heat radiation plate over the plurality of semiconductor devices; and subsequently cutting the substrate and the heat radiation plate to separate each of the semiconductor devices, further comprising the step of sealing the semiconductor devices to the substrate using resin; and the step of attaching an upper mold and a lower mold about the substrate and semiconductor devices to form a cavity, wherein the resin is injected into an opening defined between the upper mold and the lower mold.

9. A method of manufacturing a semiconductor device comprising the steps of:

attaching a plurality of semiconductor devices to a substrate;

placing a heat radiation plate over the plurality of semiconductor devices; and subsequently cutting the substrate and the heat radiation plate to separate each of the semiconductor devices, further comprising the step of sealing the semiconductor devices to the substrate using resin;

wherein the heat radiation plate includes a plurality of openings and the method further comprises attaching a frame member around a periphery of the substrate having the semiconductor devices attached thereto, and disposing the heat radiation plate on the frame member, and the resin is injected through the openings of the heat radiation plate.

10. The method of claim 9, wherein each of the openings in the heat radiation plate is disposed between adjacent ones of the semiconductor devices, and formed on cutting lines of the heat radiation plate.

* * * * *